US012566286B2

(12) United States Patent
Dubertret et al.

(10) Patent No.: US 12,566,286 B2
(45) Date of Patent: Mar. 3, 2026

(54) FILTER FOR GLASS CONTAINER

(71) Applicant: NEXDOT, Romainville (FR)

(72) Inventors: Benoît Dubertret, Romainville (FR);
Guillaume Naudin, Romainville (FR);
Michele D'Amico, Romainville (FR);
Wilfried Solo-Ojo, Romainville (FR)

(73) Assignee: Nexdot, Romainville (FR)

( * ) Notice: Subject to any disclaimer, the term of this
patent is extended or adjusted under 35
U.S.C. 154(b) by 688 days.

(21) Appl. No.: 17/801,126

(22) PCT Filed: Feb. 19, 2021

(86) PCT No.: PCT/EP2021/054193
§ 371 (c)(1),
(2) Date: Aug. 19, 2022

(87) PCT Pub. No.: WO2021/165487
PCT Pub. Date: Aug. 26, 2021

(65) Prior Publication Data
US 2023/0086353 A1 Mar. 23, 2023

(30) Foreign Application Priority Data

Feb. 21, 2020 (EP) ..................................... 20305171

(51) Int. Cl.
*G02B 5/20* (2006.01)
*B65D 23/08* (2006.01)
(Continued)

(52) U.S. Cl.
CPC ......... *G02B 5/206* (2013.01); *B65D 23/0821*
(2013.01); *B65D 81/30* (2013.01);
(Continued)

(58) Field of Classification Search
CPC .......... G02B 5/20; B65D 81/30; B65D 85/72;
C03C 17/005
See application file for complete search history.

(56) References Cited

U.S. PATENT DOCUMENTS

| | | | |
|---|---|---|---|
| 11,549,025 B2 | 1/2023 | Seo et al. | |
| 2006/0097624 A1 | 5/2006 | Murase et al. | |
| 2011/0226786 A1* | 9/2011 | Remington, Jr. ..... | C03C 17/007 |
| | | | 427/508 |

FOREIGN PATENT DOCUMENTS

| | | |
|---|---|---|
| EP | 3466885 A1 | 4/2019 |
| ES | 2737753 A1 | 1/2020 |

(Continued)

OTHER PUBLICATIONS

International Search Report and Written Opinion issued on May 18,
2021, in connection with corresponding International Patent Appli-
cation No. PCT/EP2021/054193; 9 pages.

*Primary Examiner* — Laura A Auer
(74) *Attorney, Agent, or Firm* — Maier & Maier, PLLC

(57) ABSTRACT

A light filtering glass container including a glass container
coated with a light filtering coating obtained by curing a
polymerizable composition including semi-conductive nan-
oparticles. The absorbance through a 5-micrometer thick
light filtering coating is greater than 0.5 for each light
wavelength ranging from 350 nm to $\lambda_{cut}$, $\lambda_{cut}$ being in the
range from 420 nm to 480 nm, and the difference of lightness
between the uncoated glass container and the glass container
with the light filtering coating is lower than 5.

19 Claims, 4 Drawing Sheets

(51) Int. Cl.

| | |
|---|---|
| *B65D 81/30* | (2006.01) |
| *B65D 85/72* | (2006.01) |
| *C03C 17/00* | (2006.01) |
| *C08F 18/24* | (2006.01) |
| *C08F 20/28* | (2006.01) |
| *C08G 77/18* | (2006.01) |
| *C08K 9/02* | (2006.01) |
| *C08K 9/04* | (2006.01) |
| *G02B 1/04* | (2006.01) |
| *G02F 1/1335* | (2006.01) |
| *H10H 29/85* | (2025.01) |

(52) U.S. Cl.

CPC ............ *B65D 85/72* (2013.01); *C03C 17/005* (2013.01); *C03C 17/009* (2013.01); *C08F 18/24* (2013.01); *C08F 20/28* (2013.01); *C08G 77/18* (2013.01); *C08K 9/02* (2013.01); *C08K 9/04* (2013.01); *G02B 1/04* (2013.01); *G02B 1/041* (2013.01); *G02B 5/207* (2013.01); *G02B 5/208* (2013.01); *G02F 1/133514* (2013.01); *H10H 29/8517* (2025.01); *C03C 2217/445* (2013.01); *C03C 2217/475* (2013.01); *C03C 2217/48* (2013.01); *C03C 2218/113* (2013.01); *C08F 2800/10* (2013.01); *C08K 2201/001* (2013.01); *C08K 2201/011* (2013.01); *G02B 2207/101* (2013.01)

(56) References Cited

FOREIGN PATENT DOCUMENTS

| | | | |
|---|---|---|---|
| KR | 1020200002611 | A | 1/2020 |
| WO | 03/018696 | A1 | 3/2003 |
| WO | 2004000971 | A1 | 12/2003 |
| WO | 2018101898 | A1 | 6/2018 |

* cited by examiner

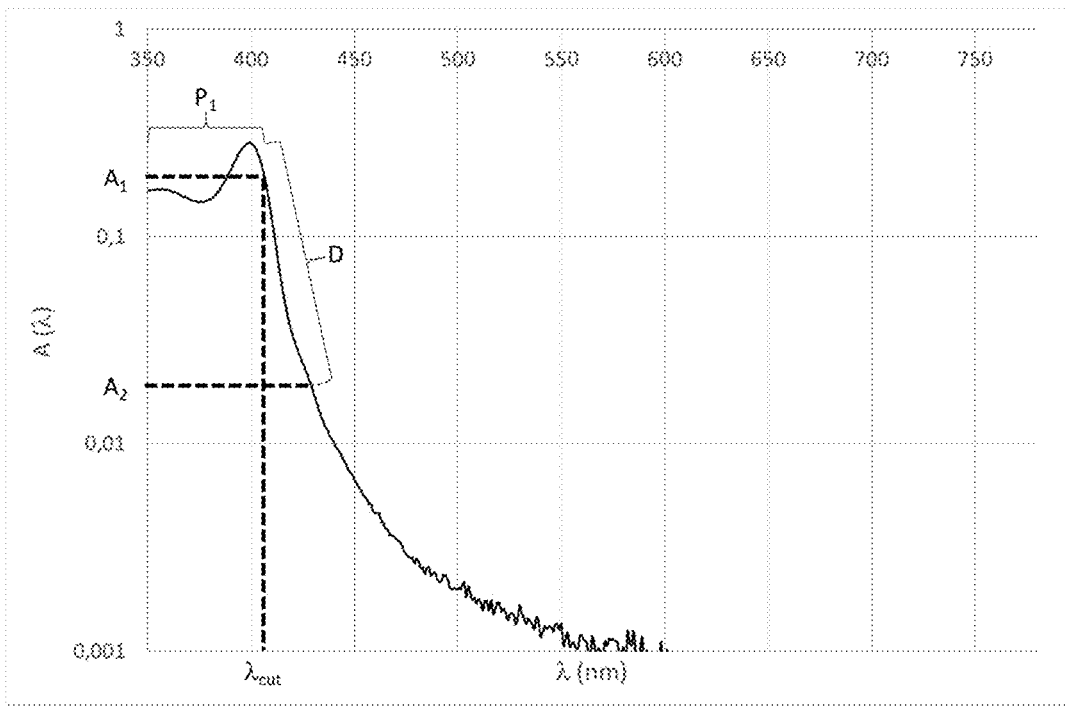
FIG. 1.1
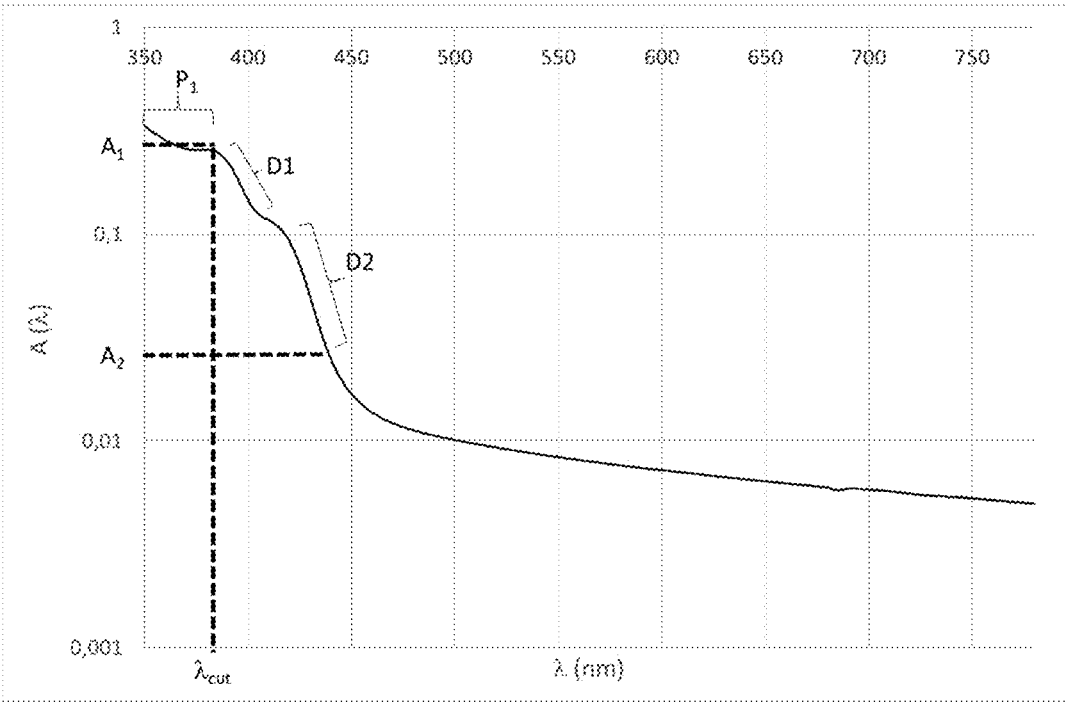
FIG. 1.2

FILTER FOR GLASS CONTAINER

FIELD

The present invention pertains to the field of glass containers. In particular, the invention relates to glass containers comprising a light filter.

BACKGROUND

It is generally known and commonly observed that the flavour quality of some kind of food products may be compromised when the food product is exposed to light. In the brewing industry it has been known for centuries that light, and in particular sunlight, may negatively affect the flavour of many types of beers. The same phenomenon has been recently evidenced in various types of wine. The flavour resulting from the light exposure is therefore commonly referred to as "lightstruck" flavour. The lightstruck flavour is considered by most consumers to be highly repulsive.

Although exact origin of the lightstruck flavour in real beverages is not totally understood, it is generally agreed that Riboflavin—vitamin B2— and its spectroscopically equivalent derivates, are prone to reduction upon photoactivation, accepting hydrogen ions and one or two electrons, thus initiating degradation reactions of other compounds, leading eventually to thiol compounds having strong flavour. In particular, 3-methyl-2-butene-1-thiol (3-MBT) is believed to be formed by the reaction between light excited Riboflavin and iso-alpha-acids. The range of wavelength where photoactivation is the more efficient is in the blue part of light spectrum, around 440-450 nm.

To avoid photoactivation of Riboflavin, several solutions have been developed.

Most common solution is the use of coloured glass containers, usually green or brown, with a very strong filtering of blue component of light—natural or artificial.

International patent application WO2011054839 discloses packaging films with light attenuation in the range of wavelength around of 440-450 nm. However, these filters have a broad band of absorption and filter out light up to wavelength of 500 nm or more, resulting in strongly coloured glass containers.

These solutions have the drawback to provide with coloured glass containers which appear less luminous and are not satisfying for some markets.

Applicant developed a light filtering coating allowing for efficient filtration of blue light in the range of wavelength around 440-450 nm while keeping a high lightness. Such a filter allows to use white glass containers and reduce the risk of lightstruck flavour generation. White glass containers allow for a better presentation of the liquid contained therein and are more adapted to high end markets.

SUMMARY

This disclosure thus relates to a light filtering glass container comprising i. a glass container having a colour (L*ug, C*ug, h*ug);

ii. a light filtering coating obtained by curing a polymerizable composition comprising semi-conductive nanoparticles, said light filtering coating being on at least a part of the glass container;

wherein the absorbance through a 5-micrometer thick light filtering coating is greater than 0.5 for each light wavelength ranging from 350 nm to $\lambda_{cut}$, $\lambda_{cut}$ being in the range from 420 nm to 480 nm; and wherein the difference of lightness between the uncoated glass container and the glass container with the light filtering coating is lower than 5.

In an embodiment, the luminous transmission of the glass container with the light filtering coating is greater than 90%, preferably greater than 95%, of the luminous transmission of the uncoated glass container.

In an embodiment, the light filtering glass has a chroma C*cg lower than 60, preferably lower than 50.

In an embodiment, the polymerizable composition is a Sol-Gel polymerizable composition. In a particular embodiment, the Sol-Gel polymerizable composition comprises monomers or oligomers selected from metal alkoxides, alkoxysilanes, alkylalkoxysilanes, epoxysilanes, epoxyalkoxysilanes, and mixtures thereof. In particular, the thickness of light filtering coating obtained by curing a Sol-Gel polymerizable composition is in a range from 1 μm to 15 μm, preferably from 1 μm to 10 μm, more preferably from 2 μm to 6 μm.

In an embodiment, the polymerizable composition comprises (meth)acrylics monomers or oligomers, epoxy monomers or oligomers, or mixture thereof. In particular, the thickness of light filtering coating obtained by curing said polymerizable composition is in a range from 2 μm to 100 μm, preferably from 3 μm to 50 μm, more preferably from 4 μm to 30 μm.

In an embodiment, the semi-conductive nanoparticles comprise a material of formula $$M_xQ_yE_zA_w \qquad (I),$$

wherein:

M is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof;

Q is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof;

E is selected from the group consisting of O, S, Se, Te, C, N, P, As, Sb, F, Cl, Br, I, or a mixture thereof;

A is selected from the group consisting of O, S, Se, Te, C, N, P, As, Sb, F, Cl, Br, I, or a mixture thereof; and x, y, z and w are independently a decimal number from 0 to 5; x, y, z and w are not simultaneously equal to 0; x and y are not simultaneously equal to 0; z and w may not be simultaneously equal to 0.

This disclosure also relates to a light filter for a glass container obtained by curing a polymerizable composition comprising semi-conductive nanoparticles, wherein the absorbance through a 5-micrometer thick light filtering coating is higher than 0.5 for each light wavelength ranging from 350 nm to $\lambda_{cut}$, $\lambda_{cut}$ being in the range from 420 nm to 480 nm; and wherein the lightness of the light filter is greater than 95.

In an embodiment, the light filter has a chroma C* lower than 60, preferably lower than 50.

In an embodiment, the polymerizable composition is a Sol-Gel polymerizable composition. In a particular embodiment, the Sol-Gel polymerizable composition comprises monomers or oligomers selected from metal alkoxides, alkoxysilanes, alkylalkoxysilanes, epoxysilanes, epoxy-alkoxysilanes, and mixtures thereof.

In an embodiment, the polymerizable composition comprises (meth)acrylics monomers or oligomers, epoxy monomers or oligomers, or mixture thereof.

BRIEF DESCRIPTION OF THE DRAWINGS

FIGS. 1.1 and 1.2 show the generic absorbance of a polymerizable composition or material comprising semi conductive nanoparticles (logarithm scale) as a function of wavelength of light from 350 nm to 780 nm (linear scale): A ($\lambda$) and the principle of determination of $\lambda_{cut}$.

DETAILED DESCRIPTION

Figure 2:
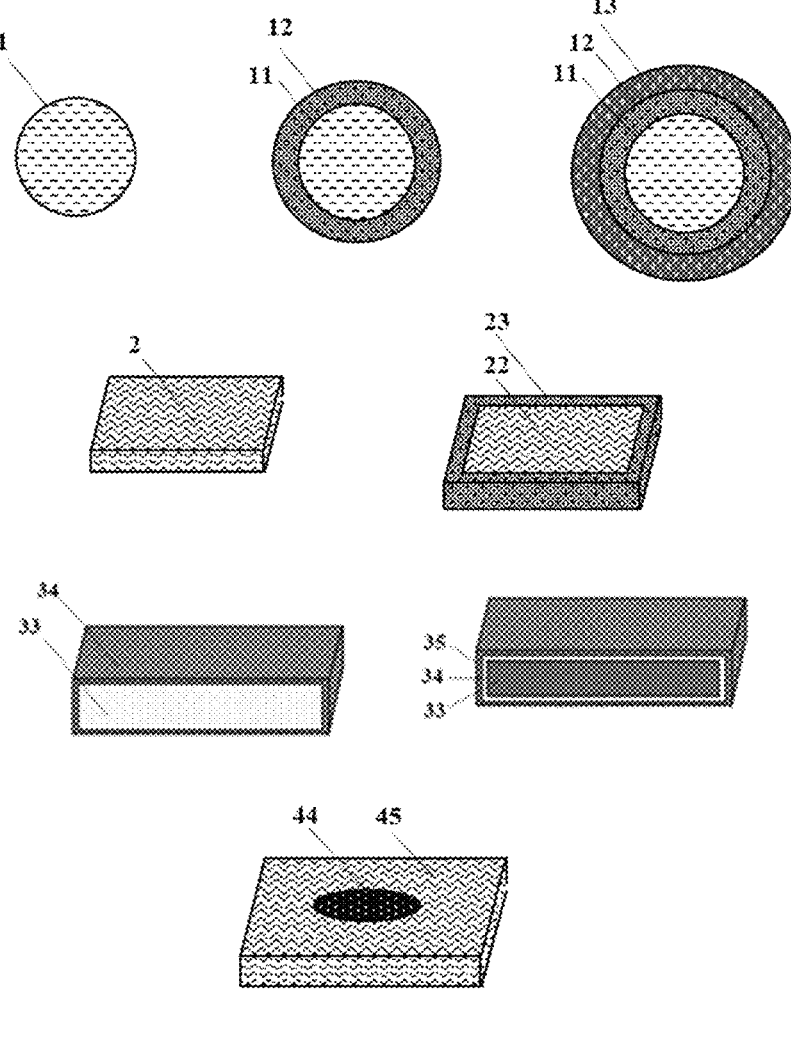
FIG. 2 is a schematic representation of various shapes (spheres and plates) and structure (homostructure, core/shell, core/crown, dot in plate) of semi-conductive nanoparticles.

In the present invention, the following terms have the following meanings:

"Absorbance" is the decimal logarithm of ratio $I_0/I$, where $I_0$ is the intensity of light incident on a sample and I is the intensity of light transmitted through said sample. In this disclosure, absorbance is measured for wavelengths in UV and visible range from 350 nm to 780 nm. For solid samples (coating), absorbance is measured for a 5-micrometer-thick sample. For liquid samples (solutions of absorbing compound), absorbance is measured in a 1-centimeter light path cuvette. Absorbance of 1 means that 9 out of 10 photons are absorbed by the sample. Absorbance of 0.3 means that 1 out of 2 photons is absorbed by the sample.

"Chroma" refers to the radial coordinate of a colour in CIE L*a*b* model. As chroma increases, saturation of colour increases. To the opposite, a low chroma correspond to a pale colour. In particular, chroma of white colour is zero.

"Color space": refers to a model for representation of color perceived by observers. In this disclosure, Color space refers to the CIE L*a*b* color space—also known as L*a*b*—defined by the International Commission on Illumination (CIE) in 1976. In CIE L*a*b*, a colour is represented by lightness (L*), position between red and green (a*) and position between yellow and blue (b*). Within this model, all colours for a given lightness can be represented within a circle, in which a* and b* are coordinates of colours.

"Colorimetric coefficients": refer to chroma and hue of a colour, in the international colorimetric system CIE L*a*b* (1976), and are calculated between 380 and 780 nm, taking the standard illuminant D65 and the observer into account (angle of 2°). The observer is a "standard observer" as defined in the international colorimetric system CIE L*a*b*.

"Core/crown" refers to a heterostructure in which a central nanoparticle: the core, is surrounded by a band of material disposed on the periphery of the core: the crown.

"Core/shell" refers to a heterostructure in which a central nanoparticle: the core, is embedded by a layer of material disposed on the core: the shell. Two successive shells may be laid, yielding core/shell/shell heterostructure. Core and shell may have the same shape, for instance core is a nanosphere and shell is a layer of essentially constant thickness yielding a spherical core/shell nanoparticle. Core and shell may have different shapes, for instance a dot—a nanosphere or a nanocube or any other nanocluster—is provided as a core and shell is grown laterally around the core, yielding an heterostructure with shape of a nanoplate but comprising a dot inside the nanoplate: the latter is named dot in plate thereafter. In some embodiments, core and shell have different compositions. In other embodiments composition varies continuously from core to shell: there is no precise boundary between core and shell but properties in centre of the core are different from properties on the outer boundary of shell.

"Hue": refers to the angular coordinate of a colour in CIE L*a*b* model. Hue is an indication of colour perceived as red, orange, yellow, green, blue or purple.

"Illuminant": refers to a theoretical source of visible light. Standard illuminants are defined by International Commission on Illumination (CIE). For natural light, standard illuminant D65 is preferred as D65 is intended to represent average daylight. In specific conditions for artificial lightning, other illuminants are used.

"Lightness"; refers to the absolute brightness value of light. In CIE LAB colorimetric space, Lightness ranges from L*=0 (black) to L*=100 (diffuse white).

"Luminous transmission": refers to an average in the 380-780 nm wavelength range that is weighted according to the sensitivity of the eye at each wavelength of the range and measured under D65 illumination conditions (daylight), as defined in the standard ISO 13666:1998.

"Nanometric size" refers to a size of matter in which quantum effects appear due to confinement. For semi-conductive nanoparticles, nanometric size has to be defined with the average Bohr radius of an electron/hole pair. Confinement is effective for size in at least one dimension of the object below 20 nm, preferably below 15 nm, more preferably below 10 nm. The stronger confinements are obtained with a size in at least one dimension below 5 nm.

"Nanoparticle" refers to a particle having a size in at least one of its dimensions below 100 nm. For a nanosphere, diameter should be below 100 nm. For a nanoplate, thickness should be below 100 nm. For a nanorod, diameter should be below 100 nm.

"Nanoplate" refers to a 2D shaped nanoparticle, wherein the smallest dimension of said nanoplate is smaller than the largest dimension of said nanoplate by a factor (aspect ratio) of at least 1.5, at least 2, at least 2.5, at least 3, at least 3.5, at least 4, at least 4.5, at least 5, at least 5.5, at least 6, at least 6.5, at least 7, at least 7.5, at least 8, at least 8.5, at least 9, at least 9.5 or at least 10.

"Semi-conductive nanoparticles" refers to particles made of a material having an electronic structure corresponding to semi-conductive materials known in electronic industry but having a nanometric size. Due to their specific electronic structure, semi-conductive materials behave as high-pass absorbing materials. Indeed, light having a wavelength more energetic than band gap may be absorbed by the semi-conductive material, yielding an electron/hole pair, an exciton, which later recombine in the material and dissipate heat, or emit light, or both. On the contrary, light having a wavelength less energetic than band gap cannot be absorbed: semi-conductive material is transparent for these wavelengths. In macroscopic semi-conductive materials, visible light is generally absorbed while near/mid infra-red light is not absorbed. When semi-conductive particles have a nanometric size, confinement—i.e. shape and nanometric size—governs electronic structure following the rules of quantum mechanics and light absorption may be limited to UV range or UV and high energy visible light. Within this disclosure, semi-conductive nanoparticles absorb light having a wavelength below a threshold, this threshold being in the range of 350 nm-800 nm.

DETAILED DESCRIPTION

This disclosure relates to a light filtering glass container comprising a glass container of determined colour and a light filtering coating.

In this disclosure, glass is meant for two types of materials.

In an embodiment, glass is a mineral material essentially made of fused silica. Glass containers may have any shape suitable to contain beverages and liquid food products, especially beers, wines and spirits. Glass containers are typically bottles or flasks. White glass containers, i.e. glass containers having almost no colour are especially suitable.

In another embodiment, glass is a polymeric material with very high optical performances, looking like mineral glass. These materials are very commonly used in packaging for luxury goods—cosmetics in particular—and are based usually on polyethylene terephthalate (PET) or polycarbonate.

The colour of glass container is determined by well know colorimetric measurements. A piece of glass is illuminated with a standard illuminant and light transmitted through the glass is analyzed according to CIE L\*a\*b\* model (standard observer, 2°), yielding Lightness $L*_{ug}$, Chroma $C*_{ug}$ and hue $h*_{ug}$ (ug stand for uncoated glass).

Representation of colour with chroma and hue is especially appropriate for white glass, as colour of white glass approaches a zero chroma, and hue is not relevant in this case.

Alternatively, the colour of a glass container is determined from the measurement of transmission spectrum with any kind of light source. By combination of the transmission spectrum with the known spectrum of illuminant D65, one is able to simulate the spectrum of light transmitted through the glass container, then compute the colour of glass container.

In addition, measure of luminous transmittance—noted Tv hereafter—through the glass container gives an indication of Lightness. Indeed, a glass container with a low chroma will appear grey if Tv is low and bright if Tv is high.

Preferred glass containers have a chroma lower than 10 and a luminous transmittance Tv higher than 90%.

In this disclosure, the glass container is coated by a light filtering coating. The light filtering coating may cover the whole glass container or a part of it.

The light filtering coating is intended to protect to content of the glass container against high energy light radiation.

Indeed, glass material is generally absorbent for UV light of wavelength below 350 nm. However, UV light of wavelength above 350 nm, and visible light—from 380 nm to 780 nm—are not totally absorbed by glass. In this transparent range of wavelengths, high energy radiations are likely to be transmitted by glass and eventually induce degradation of the content of glass containers. In order to limit this effect, the light filtering coating herein disclosed has an absorbance greater than 0.5 for each light wavelength ranging from 350 nm to $\lambda_{cut}$, $\lambda_{cut}$ being in the range from 420 nm to 480 nm. The absorbance is measured through a 5-micrometer thick light filtering coating.

In an embodiment, $\lambda_{cut}$ is in the range from 430 nm to 480 nm. In particular, $\lambda_{cut}$ may be in a range selected in the group of: a range from 450 nm to 460 nm, a range from 450 nm to 470 nm, a range from 450 nm to 480 nm, a range from 460 nm to 470 nm, a range 440 nm to 450 nm, a range from 440 nm to 460 nm, a range from 440 nm to 470 nm, a range 430 nm to 450 nm, a range from 430 nm to 460 nm, a range from 430 nm to 470 nm or a range from 430 nm to 440 nm.

In an embodiment, absorbance is higher than 1, more preferably 1.5 for each light wavelength ranging from 350 nm to $\lambda_{cut}$.

The exact value of $\lambda_{cut}$ is determined according to the foreseen content of the glass containers. In the specific case of protection against lightstruck flavour, $\lambda_{cut}$ is selected in the range from 450 nm to 480 nm.

FIG. 1.1 shows the generic absorbance curve of a light filtering coating as a function of wavelength of light from 350 nm to 780 nm: $A(\lambda)$. The absorbance curve presents three zones. In low wavelength area, i.e. in UV light and high energy visible light, absorbance is high and/or is roughly constant, defining a first plateau $P_1$ with an average absorbance $A_1$. After first plateau $P_1$, absorbance decreases sharply to reach a value $A_2$ of a tenth of $A_1$: $A_2=A_1/10$, thus defining a decreasing zone D. The limit between plateau $P_1$ and decreasing zone D defines the wavelength of transition $\lambda_{cut}$. After the decreasing zone D, absorbance may decrease and/or stabilize in a second plateau $P_2$, extending up to red end of visible light, namely 780 nm.

The width of decreasing zone D is generally less than 100 nm, preferably less than 50 nm, more preferably less than 40 nm, even preferably less than 30 nm.

While absorbance curves always have this generic shape, details vary with the nature of materials used and exact determination of $\lambda_{cut}$ may be difficult.

In some embodiments, absorbance curve shows a clear maximum at the limit of $P_1$, and D, as shown on FIG. 1.1. In this embodiment, $\lambda_{cut}$ may be defined by the following formula, where $\lambda_{cut}$ is in the decreasing zone D:

$$A(\lambda_{cut}) = \frac{\int_{350}^{\lambda_{cut}} A(\lambda)d\lambda}{\lambda_{cut} - 350}$$

In this embodiment, $\lambda_{cut}$ may be defined alternatively by the following formula for a local maximum:

$$\left. \frac{\partial \log A}{\partial \lambda} \right)_{\lambda_{cut}} = 0$$

In other embodiments, absorbance curve is monotonously decreasing slowly before decreasing sharply, as shown on FIG. 1.2. In this embodiment, $\lambda_{cut}$ may be defined by the lowest value of $\lambda$ where decrease of absorbance become significant in decreasing zone, for instance where:

$$\frac{\partial \log A}{\partial \lambda} < -0,01$$

The different determinations of $\lambda_{cut}$ proposed above give different but near values. In this disclosure, a value of $\lambda_{cut}$ has to be considered as a rounded value with uncertainty of ±5 nm.

The value of $\lambda_{cut}$ may be selected within the range of 420 nm to 480 nm by a proper selection of semi conductive nanoparticles composition, shape and structure.

Filtering of light having wavelength longer than 480 nm is not particularly desirable. Indeed, such light is less energetic and does not induce degradation in food products for a reasonable exposure time. In addition, light with wavelength longer than 480 nm is associated with green and yellow colour, where human eye is very sensitive. Then, filtering such light would result in a decrease in lightness and strong colouring effect, which are undesirable.

To the contrary, light filtering coating herein disclosed does not change significantly lightness of the glass container onto which it is coated. In other words, light filtering coating is highly clear. So as to evaluate this performance, the colour of the glass container with the light filtering coating is measured according to the method disclosed above for uncoated glass container, yielding Lightness L*cg, Chroma C*cg and hue h*cg (cg stand for coated glass).

In this disclosure, the difference of lightness between the uncoated glass container and the glass container with the light filtering coating is lower than 5.

The lower the difference, the preferred the light filtering coating. In particular, the difference of lightness may be lower than 4, preferably lower than 3, more preferably lower than 2.

In an embodiment, the Chroma C*cg of the light filtering glass container is lower than 60, preferably lower than 50. Even if this chroma may appear large, colour balancing additives may be added to the light filtering coating to lower chroma but with a lowering of lightness.

In a particular embodiment, the difference of lightness between the uncoated glass container and the glass container with the light filtering coating is lower than 2 and the Chroma C*cg of the light filtering glass container is lower than 60.

In an embodiment, the luminous transmission of the glass container with the light filtering coating is greater than 90%, preferably greater than 95%, of the luminous transmission of the uncoated glass container. In these conditions, the lightness of the glass container is not degraded by the light filtering coating.

In this disclosure, the light filtering coating is obtained by curing a polymerizable composition comprising semi-conductive nanoparticles.

Polymerizable Composition

This disclosure relates to a polymerizable composition. The composition comprises at least one monomer or oligomer; at least one catalyst for initiating the polymerization of said monomer or oligomer; and semi-conductive nanoparticles which are dispersed in said monomer or oligomer.

Suitable polymerizable composition for the light filtering coating may be of any type, as soon as it is sufficiently transparent to visible light and allows for dispersion of the semi-conductive nanoparticles.

Suitable monomers or oligomers are selected from allylic compounds, (meth)acrylic compounds, epoxy compounds, compounds used to prepare polyurethane or polythiourethane materials. Mixtures of these monomers, or multifunctional monomers—in particular epoxy-acrylic compounds—are also suitable. Besides, compounds used to prepare materials usually known as Sol-Gels are suitable.

In this disclosure, a (meth)acrylic monomer or (meth)acrylic oligomer is a compound comprising having acrylic or methacrylic groups. (Meth)acrylates may be monofunctional (meth)acrylates or multifunctional (meth)acrylates.

Suitable (meth)acrylic monomers or oligomers are multifunctional (meth)acrylates and may be selected from the group consisting of diacrylate, triacrylate, tetraacrylate and hexaacrylate monomers, such as pentaerythritol triacrylate or pentaerythritol tetraacrylate. In particular, the polyfunctional monomer is preferably selected from the group consisting of 1,4-butanedioldiacrylate, 1,6-hexanedioldiacrylate, dipropyleneglycol diacrylate pentaerythritol triacrylate, pentaerythritol tetraacrylate, dipentaerythritol tetraacrylate, dipentaerythritol hexaacrylate, silicone hexaacrylate, and mixtures thereof. The use of multifunctional acrylate monomers results in improved scratch resistance and better adhesion to thermoplastic substrates like PET or polycarbonate.

In an embodiment especially adapted for polymerization of (meth)acrylic monomers or oligomers, the catalyst meant for initiating polymerization is a free radical initiator. In a particular embodiment, catalyst is selected in the group consisting of a peroxodicarbonate, a peroxyester, a perketal, and mixtures thereof. In an alternative particular embodiment, catalyst is an azo compound selected from the group consisting of 2,2'-azobisisobutyronitrile, dimethyl 2,2'-azobis(2-methylpropionate), 2,2'-azobis(2-methylbutyronitrile), 2,2'-azobis(2,4-dimethylvaleronitrile), 4,4'-azobis(4-cyanopentanoic acid), and mixtures thereof.

Suitable epoxy monomers or oligomers are multifunctional epoxy and may be selected from the group consisting of diglycerol tetraglycidyl ether, dipentaerythritol tetraglycidyl ether, sorbitol polyglycidyl ether, polyglycerol polyglycidyl ether, pentaerythritol polyglycidyl ether such as pentaerythritol tetraglycidyl ether, trimethylolethane triglycidyl ether, trimethylolmethane triglycidyl ether, trimethylolpropane triglycidyl ether, triphenylolmethane triglycidyl ether, trisphenol triglycidyl ether, tetraphenylol ethane triglycidyl ether, tetraglycidyl ether of tetraphenylol ethane, p-aminophenol triglycidyl ether, 1,2,6-hexanetriol triglycidyl ether, glycerol triglycidyl ether, diglycerol triglycidyl ether, glycerol ethoxylate triglycidyl ether, Castor oil triglycidyl ether, propoxylated glycerine triglycidyl ether, ethylene glycol diglycidyl ether, 1,4-butanediol diglycidyl ether, neopentyl glycol diglycidyl ether, cyclohexanedimethanol diglycidyl ether, dipropylene glycol diglycidyl ether, polypropylene glycol diglycidyl ether, dibromoneopentyl glycol diglycidyl ether, hydrogenated bisphenol A diglycidyl ether, (3,4-epoxycyclohexane) methyl 3,4-epoxycylohexylcarboxylate and mixtures thereof. The use of such polyepoxides improves toughness of the resulting cured coating and adhesion to thermoset resin substrates.

In an embodiment especially adapted for polymerization of epoxy monomers or oligomers, the catalyst—often referred to as hardening agents—meant for initiating polymerization is selected from amines, anhydrides, phenols or thiols.

In this disclosure, mixture of monomers or oligomers having at least two isocyanate functions with monomers or oligomers having at least two alcohol, thiol or epithio functions are suitable polymerizable compositions.

Monomer or oligomer having at least two isocyanate functions may be selected from symmetric aromatic diisocyanate such as 2,2' Methylene diphenyl diisocyanate (2,2' MD I), 4,4' dibenzyl diisocyanate (4,4' DBDI), 2,6 toluene diisocyanate (2,6 TDI), xylylene diisocyanate (XDI), 4,4' Methylene diphenyl diisocyanate (4,4' MDI) or asymmetric aromatic diisocyanate such as 2,4' Methylene diphenyl diisocyanate (2,4' MDI), 2,4' dibenzyl diisocyanate (2,4' DBDI), 2,4 toluene diisocyanate (2,4 TDI) or alicyclic diisocyanates such as Isophorone diisocyanate (IPDI), 2, 5(or 2, 6)-bis(iso-cyanatomethyl)-Bicyclo[2.2.1]heptane (NDI) or 4,4' Diisocyanato-methylenedicyclohexane (H12MD I) or aliphatic diisocyanates such as hexamethylene diisocyanate (HDI) or mixtures thereof.

Monomer or oligomer having thiol function may be selected from Pentaerythritol tetrakis mercaptopropionate, Pentaerythritol tetrakis mercaptoacetate, 4-Mercaptomethyl-3,6-dithia-1,8-octanedithiol, 4-mercaptomethyl-1,8-dimercapto-3,6-dithiaoctane, 2,5-dimercaptomethyl-1,4-dithiane, 2,5-bis[(2-mercaptoethyl)thiomethyl]-1,4-dithiane, 4,8-dimercaptomethyl-1, 1 1-dimercapto-3,6,9-trithiaundecane, 4,7-dimercaptomethyl-1,1 1-dimercapto-3, 6,9-trithiaundecane, 5,7-dimercaptomethyl-1,1 1-dimercapto-3,6,9-trithiaundecane and mixture thereof.

Monomer or oligomer having epithio function may be selected from bis(2,3-epithiopropyl)sulfide, bis(2,3-epithiopropyl)disulfide and bis[4-(beta epithiopropylthio)phenyl] sulfide, bis[4-(beta-epithiopropyloxy)cyclohexyl]sulfide.

In an embodiment, the composition of the polymerizable composition yielding polyurethane or polythiourethane materials is stoichiometric, i.e. the number of isocyanate functions on monomers is substantially equal to the number of alcohol, thiol or epithio functions on monomers, so as to obtain a fully reticulated polymer.

In an embodiment especially adapted to compositions yielding polyurethane or polythiourethane materials, the catalyst meant for initiating polymerization is an organotin compound, and may be selected from dimethyltin chloride, dibutyltin chloride, and mixtures thereof.

In this disclosure, compounds used to prepare materials usually known as Sol-Gels are suitable. Monomers or oligomers may be selected from alkoxysilanes, alkylalkoxysilanes, epoxysilanes, epoxyalkoxysilanes, and mixtures thereof. These monomers or oligomers may be prepared in a solvent to form the polymerizable composition. Suitable solvents are polar solvents, such as water/alcohol mixtures.

Alkoxysilanes may be selected among compounds having the formula: $R_pSi(Z)_{4-p}$ in which the R groups, identical or different, represent monovalent organic groups linked to the silicon atom through a carbon atom, the Z groups are identical or different and represent hydrolyzable groups or hydrogen atoms, p is an integer ranging from 0 to 2. Suitable alkoxysilanes may be selected in the group consisting of tetraethoxysilane $Si(OC_2H_5)_4$ (TEOS), tetramethoxysilane $Si(OCH_3)_4$ (TMOS), tetra(n-propoxy)silane, tetra(i-propoxy)silane, tetra(n-butoxy)silane, tetra(sec-butoxy)silane or tetra(t-butoxy)silane.

Alkylalkoxysilanes may be selected among compounds having the formula: $R_nY_mSi(Z_1)_{4-n-m}$ in which the R groups, identical or different, represent monovalent organic groups linked to the silicon atom through a carbon atom, the Y groups, identical or different, represent monovalent organic groups linked to the silicon atom through a carbon atom, the Z groups are identical or different and represent hydrolyzable groups or hydrogen atoms, m and n are integers such that m is equal to 1 or 2 and n+m=1 or 2.

Epoxyalkoxysilanes may be selected among compounds having the formula: $R_nY_mSi(Z_1)_{4-n-m}$ in which the R groups, identical or different, represent monovalent organic groups linked to the silicon atom through a carbon atom, the Y groups, identical or different, represent monovalent organic groups linked to the silicon atom through a carbon atom and containing at least one epoxy function, the Z groups are identical or different and represent hydrolyzable groups or hydrogen atoms, m and n are integers such that m is equal to 1 or 2 and n+m=1 or 2.

Suitable epoxysilanes may be selected from the group consisting of glycidoxy methyl trimethoxysilane, glycidoxy methyl triethoxysilane, glycidoxy methyl tripropoxysilane, α-glycidoxy ethyl trimethoxysilane, α-glycidoxy ethyl triethoxysilane, β-glycidoxy ethyl trimethoxysilane, β-glycidoxy ethyl triethoxysilane, β-glycidoxy ethyl tripropoxysilane, α-glycidoxy propyl trimethoxysilane, α-glycidoxy propyl triethoxysilane, α-glycidoxy propyl tripropoxysilane, β-glycidoxy propyl trimethoxysilane, β-glycidoxy propyl triethoxysilane, β-glycidoxy propyl tripropoxysilane, γ-glycidoxy propyl trimethoxysilane, γ-glycidoxy propyl triethoxysilane, γ-glycidoxy propyl tripropoxysilane, 2-(3,4-epoxycyclohexyl) ethyltrimethoxysilane, 2-(3,4-epoxycyclohexyl) ethyltriethoxysilane.

In an embodiment especially adapted to compositions yielding Sol-Gel materials, the catalyst meant for initiating polymerization is a Lewis Acid. Carboxylates of metals such as zinc, titanium, zirconium, tin or magnesium; aluminum acetylacetonate $Al(AcAc)_3$ are suitable catalysts.

In an embodiment, the amount of alkoxysilanes is 0 to 90% by weight based on the theoretical dry extract of the polymerizable composition; the amount of alkyl alkoxysilanes is 20 to 90% by weight based on the theoretical dry extract of the polymerizable composition, the amount of catalyst is 0.1 to 5% by weight based on the theoretical dry extract of the polymerizable composition.

By the theoretical dry extract of the composition, it is meant the weight of the composition from which all solvent and volatile moieties released during polymerization, e.g. cleavable alkyl substitutes of alkylsilanes, are removed.

The amount of monomer or oligomer according to the present disclosure may be from 20 to 99% by weight, in particular from 50 to 99% by weight, more particularly from 80 to 98% by weight, even more particularly from 90 to 97% by weight, based on the theoretical dry extract of the polymerizable composition.

The amount of catalyst in the polymerizable composition according to the present disclosure may be from 0.5 to 5.0% by weight. For methacrylic and other monomers polymerizable by radical, addition or condensation process, the amount of catalyst in the polymerizable composition may be in particular from 0.25 to 2.5% by weight, more particularly from 0.5 to 2.0% by weight, based on the theoretical dry extract of the composition. For Sol-Gel polymerizable composition, the amount of catalyst in the polymerizable composition may be in particular from 0.75 to 2.5% by weight, more particularly from 0.5 to 1.5% by weight, based on the theoretical dry extract of the composition.

The thickness of the light filtering coating may be varied according to the type of monomers or oligomers used and according to mechanical properties of the coating. In particular, light filtering coatings obtained from (meth)acrylics monomers or oligomers, epoxy monomers or oligomers, or mixture thereof may have a thickness in the range of 2 μm to 100 μm, preferably from 3 μm to 50 μm, more preferably from 4 μm to 30 μm. Alternatively, light filtering coatings obtained from Sol-Gel polymerizable composition may have a thickness in the range of 1 μm to 15 μm, preferably from 1 μm to 10 μm, more preferably from 2 μm to 6 μm.

Semi-Conductive Nanoparticles

In this disclosure, the polymerizable composition comprises semi-conductive nanoparticles.

Materials may have various compositions and structures. Among mineral materials, some are electrically conductive, for instance metals. Some are electrically insulating, such as silicon oxide or tin oxide. Of particular interest in this disclosure are materials made of semi-conductive materials, well known in electronic industry. Semi-conductive materials may have a macroscopic size. If semi-conductive materials have a nanometric size, their electronic and optical properties are modified.

In this disclosure, semi-conductive nanoparticles bring especially interesting light absorbing properties to glass containers. In particular, with proper selection of composition and structure of semi-conductive nanoparticles, light absorbers having a sharp transition between range of absorbed light (of high energy) and range of transmitted light (low energy) may be designed. Semi-conductive nanoparticles absorb light having a wavelength below a threshold $\lambda_{cut}$, this threshold being in the range of 420 nm-480 nm.

Composition

In one embodiment, the semi-conductive nanoparticles comprise a material of formula $$M_xQ_yE_zA_w(I),$$

in which M is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof; Q is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof; E is selected from the group consisting of O, S, Se, Te, C, N, P, As, Sb, F, Cl, Br, I, or a mixture thereof; and A is selected from the group consisting of O, S, Se, Te, C, N, P, As, Sb, F, Cl, Br, I, or a mixture thereof. x, y, z and w are independently a decimal number from 0 to 5; x, y, z and w are not simultaneously equal to 0; x and y are not simultaneously equal to 0; z and w may not be simultaneously equal to 0.

In particular, semi-conductive nanoparticles may comprise a material of formula MxEy, in which M is Zn, Cd, Hg, Cu, Ag, Al, Ga, In, Si, Ge, Pb, Sb or a mixture thereof; and E is O, S, Se, Te, N, P, As or a mixture thereof. x and y are independently a decimal number from 0 to 5, with the proviso that x and y are not 0 at the same time.

In a specific embodiment, the semi-conductive nanoparticles comprise a material selected from the group consisting of CdS, CdSe, CdTe, ZnS, ZnSe, ZnTe, HgS, HgSe, HgTe, HgO, GeS, GeSe, GeTe, SnS, SnSe, SnTe, PbS, PbSe, PbTe, GeS$_2$, GeSe$_2$, SnS$_2$, SnSe$_2$, CuInS$_2$, CuInSe$_2$, AgInS$_2$, AgInSe$_2$, CuS, Cu$_2$S, Ag$_2$S, Ag$_2$Se, Ag$_2$Te, FeS, FeS$_2$, InP, Cd$_3$P$_2$, Zn$_3$P$_2$, CdO, ZnO, FeO, Fe$_2$O$_3$, Fe$_3$O$_4$, Al$_2$O$_3$, TiO$_2$, MgO, MgS, MgSe, MgTe, AlN, AlP, AlAs, AlSb, GaN, GaP, GaAs, GaSb, InN, InP, InAs, InSb, TlN, TlP, TlAs, TlSb, MoS$_2$, PdS, Pd$_4$S, WS$_2$, CsPbCl$_3$, PbBr$_3$, CsPbBr$_3$, CH$_3$NH$_3$PbI$_3$, CH$_3$NH$_3$PbCl$_3$, CH$_3$NH$_3$PbBr$_3$, CsPbI$_3$, FAPbBr$_3$ (where FA stands for formamidinium), or a mixture thereof.

Shape

In this disclosure, semi-conductive nanoparticles may have different shapes, provided that they present a nanometric size leading to confinement of exciton created in the nanoparticle.

Semi-conductive nanoparticles may have nanometric sizes in three dimensions, allowing confinement of excitons in all three spatial dimensions. Such nanoparticles are for instance nanocubes or nanospheres also known as nanodots 1 as shown on FIG. 2.

Semi-conductive nanoparticles may have a nanometric sizes in two dimensions, the third dimension being larger: excitons are confined in two spatial dimensions. Such nanoparticles are for instance nanorods, nanowires or nanorings.

Semi-conductive nanoparticles may have a nanometric size in one dimension, the other dimensions being larger: excitons are confined in one spatial dimension only. Such nanoparticles are for instance nanoplates 2 as shown on FIG. 2, nanosheets, nanoribbons or nanodisks.

The exact shape of semi-conductive particles defines confinement properties; then electronic and optical properties depending on composition of semi-conductive particle, in particular the band gap, then $\lambda_{cut}$ It has been also observed that nanoparticles with a nanometric size in one dimension, especially nanoplates, present a sharper decreasing zone as compared to nanoparticles with other shapes. Indeed, width of decreasing zone is enlarged if nanometric size of nanoparticles fluctuates around a mean value. When nanometric size is controlled in only one dimension, i.e. for nanoplates, by a strict number of atomic layers, thickness fluctuations are almost null and transition between absorbing and non-absorbing state is very sharp.

Structure

In an embodiment, semi-conductive nanoparticles are homostructures. By homostructure, it is meant that the nanoparticle is homogenous and has the same local composition in all its volume.

In an alternative embodiment, semi-conductive nanoparticles are heterostructures. By heterostructure, it is meant that the nanoparticle is comprised of several sub-volumes, each sub-volume having a different composition from neighbouring sub-volumes. In a particular embodiment, all sub-volumes have a composition defined by formula (I) disclosed above, with different parameters, i.e., elemental composition and stoichiometry.

Example of heterostructure are core/shell nanoparticles as shown on FIG. 2, the core having any shape disclosed above: nanosphere 11 or 44, nanoplate 33. A shell is a layer covering totally or partially the core: nanosphere 12, nanoplate 34 or 45. A particular example of core/shell heterostructure is a multi-layered structure comprising a core and several successive shells: nanospheres 12 and 13, nanoplates 34 and 35. For convenience, these multi-layered heterostructures are named core/shell hereafter. Core and shell may have the same shape—sphere 11 in sphere 12 for example—or not—dot 44 in plate 45 for instance.

Another example of heterostructure are core/crown nanoparticles as shown on FIG. 2, the core having any shape disclosed above. A crown 23 is a band of material disposed on the periphery of the core 22—here a nanoplate. This heterostructure is particularly useful with cores being nanoplates and crown disposed on the edges of the nanoplate.

FIG. 2 shows clear boundaries between core on one hand and shell or crown on the other hand. Heterostructures also enclose structures in which composition varies continuously from core to shell/crown: there is no precise boundary between core and shell/crown but properties in centre of the core are different from properties on the outer boundary of shell/crown.

In an advantageous embodiment, semi-conductive nanoparticles have a largest dimension below 500 nm, in particular below 300 nm, ideally below 200 nm. Semi-conductive nanoparticles of small size do not induce light scattering when dispersed in a material having a different refractive index.

Table 1 below discloses various semi-conducting nanoparticles suitable for use in this disclosure.

TABLE 1

| | | Homo/Hetero | | Composition-formula (I) | | | | |
|---|---|---|---|---|---|---|---|---|
| | Shape | structure | Dimensions (nm) | Mx | Qy | Ez | Aw | $\lambda_{cut}$ (nm) |
| 1 | Plate | Core(gradient)/Shell (Dot in Plate) | Core: gradient Shell: 1.2*15*15 | Cd 1 Cd 1 | — — | Se 0.5 — | S 0.5 S 1 | 425 |
| 2 | Plate | Core(Plate)/Shell | Core: 1.2*10*15 Shell: 3*15*20 | Cd 1 Cd 0.1 | — Zn 0.9 | Se 0.3 S 1 | S 0.7 — | 478 |
| 3 | Sphere | Homo | 8.5 | Zn 1 | — | Se 1 | — | 441 |
| 4 | Sphere | Homo | 9.6 | Zn 1 | — | Se 1 | — | 446 |
| 5 | Plate | Homo | 1.2*12*20 | Cd | | Se 0.75 | S 0.25 | 480 |
| 6 | Plate | Homo | 1.2*12*22 | Cd | | Se | | 512 |
| 7 | Plate | Homo | 1.2*12*21 | Cd | | Se 0.5 | S 0.5 | 445 |
| 8 | Plate | Homo | 1.5*12*20 | Cd | | S | | 460 |

In an embodiment, semi-conductive nanoparticles are capped with organic compounds. By capped, it is meant that organic compounds are adsorbed or absorbed on the surface of the semi-conductive nanoparticle. Capping compounds provide several advantages. In particular, capping agent may behave as dispersing agents, avoiding semi-conductive nanoparticles agglomeration in polymerizable composition or during polymerization.

Besides, capping agents may influence optical properties of semi-conductive nanoparticles as they modify boundary conditions of nanoparticles: $\lambda_{cut}$ may be adjusted by selection of capping compounds.

Suitable capping compounds are ligands comprising at least one chemical moiety $M_A$ having an affinity to the surface of the semi-conductive nanoparticle, by any kind of intermolecular interactions.

In particular, $M_A$ may have an affinity for a metal element present at the surface of the semi-conductive nanoparticle. $M_A$ may be a thiol, a dithiol, an imidazole, a catechol, a pyridine, a pyrrole, a thiophene, a thiazole, a pyrazine, a carboxylic acid or carboxylate, a naphthyridine, a phosphine, a phosphine oxide, a phenol, a primary amine, a secondary amine, a tertiary amine, a quaternary amine or an aromatic amine.

Alternatively, $M_A$ may have an affinity for a non-metal element selected from the group of O, S, Se, Te, C, N, P, As, Sb, F, Cl, Br, I present at the surface of the semi-conductive nanoparticle. $M_A$ may be an imidazole, a pyridine, a pyrrole, a thiazole, a pyrazine, a naphthyridine, a phosphine, a phosphine oxide, a primary amine, a secondary amine, a tertiary amine, a quaternary amine or an aromatic amine.

Ligands may comprise several chemical moieties $M_A$, identical or different. Ligands may be a polymer having chemical moieties $M_A$, identical or different, as pending groups along the polymer backbone or repeated groups in the polymer backbone.

In an embodiment, semi-conductive nanoparticles are encapsulated within a matrix, forming capsules. By encapsulated, it is meant that semi-conductive nanoparticles are dispersed within an encapsulating material so that the encapsulating material covers all surface of semi-conductive nanoparticles. In other words, encapsulating material forms a barrier around semi-conductive nanoparticles. Such a barrier as several advantages. In particular, semi-conductive nanoparticles may be protected against chemicals, e.g. moisture, oxidants. Besides, semi-conductive nanoparticles that are not dispersible in a medium may be encapsulated in a material whose compatibility with said medium is good: the barrier behaves as a compatibilization agent. Last, encapsulated semi-conductive nanoparticles may be under the form of a powder dispersible in a medium instead of a dispersion in a solvent, thereby providing with easier handling in current processes.

Encapsulating material may be organic, in particular organic polymers. Suitable organic polymers are polyacrylates; polymethacrylates; polyacrylamides; polyamides; polyesters;

polyethers; polyoelfins; polysaccharides; polyurethanes (or polycarbamates), polystyrenes; polyacrylonitrilebutadienestyrene (ABS); polycarbonate; poly(styrene acrylonitrile); vinyl polymers such as polyvinyl chloride; polyvinyl alcohol, polyvinyl acetate, polyvinylpyrrolidone, polyvinyl pyridine, polyvinylimidazole; poly(p-phenylene oxide); poly sulfone; polyethersulfone; polyethylenimine; polyphenylsulfone;

poly(acrylonitrile styrene acrylate); polyepoxides, polythiophenes, polypyrroles;

polyanilines; polyaryletherketones; polyfurans; polyimides; polyimidazoles;

polyetherimides; polyketones; polynucleotides; polystyrene sulfonates; polyetherimines;

polyamic acid; or any combinations and/or derivatives and/or copolymers thereof.

Encapsulating material may be mineral, in particular mineral oxides or mixture of mineral oxides. Suitable mineral oxides are $SiO_2$, $Al_2O_3$, $TiO_2$, $ZrO_2$, FeO, ZnO, MgO, $SnO_2$, $Nb_2O_5$, $CeO_2$, BeO, $IrO_2$, CaO, $Sc_2O_3$, Na2O, BaO, $K_2O$, $TeO_2$, MnO, $B_2O_3$, $GeO_2$, As2O3, $Ta_2O_5$, Li2O, SrO, $Y_2O_3$, HfO2, $MoO_2$, $Tc_2O_7$, ReO2, $Co_3O_4$, OsO, RhO2, $Rh_2O_3$, CdO, HgO, $Tl_2O$, $Ga_2O_3$, $In_2O_3$, $Bi_2O_3$, $Sb_2O_3$, $PoO_2$, $SeO_2$, $Cs_2O$, $La_2O_3$, $Pr_6O_{11}$, $Nd_2O_3$, $La_2O_3$, $Sm_2O_3$, $Eu_2O_3$, $Tb_4O_7$, $Dy_2O_3$, $Ho_2O_3$, $Er_2O_3$, $Tm_2O_3$, $Yb_2O_3$, $Lu_2O_3$, $Gd_2O_3$, or a mixture thereof. Preferred mineral encapsulating materials are $SiO_2$, $Al_2O_3$ and ZnO. In particular, nanoparticles comprising Zn may be encapsulated by $SiO_2$ or ZnO and nanoparticles comprising Cd may be encapsulated by $SiO_2$, $Al_2O_3$ or mixture of $SiO_2$ and $Al_2O_3$.

In an advantageous embodiment, capsules are nanoparticles, with a largest dimension below 500 nm, in particular below 300 nm, ideally below 200 nm. Capsules of small size do not induce light scattering when dispersed in a material having a different refractive index.

The amount of semi-conductive nanoparticles in a capsule according to the present disclosure may be from 1.0 to 90% by weight, in particular from 2.5 to 50% by weight, more particularly from 3.0 to 25% by weight, based on the total weight of the capsule.

The amount of semi-conductive nanoparticles in the polymerizable composition according to the present disclosure may be from 10 ppm to 1% by weight, in particular from 20 ppm to 0.5% by weight, more particularly from 25 ppm to 0.25% by weight, based on the theoretical dry extract of the composition. In this disclosure, the organic material that is used to cap semi-conductive nanoparticles or the material that is used to encapsulate semi-conductive nanoparticles is not included in the amount of semi-conductive nanoparticles. For the sake of clarity, a polymerizable composition comprising 1% weight, based on the theoretical dry extract of the composition, of aggregates comprising 30% weight of semi-conductive nanoparticles embedded in 70% weight of a mineral matrix, comprises 0.3% weight of semi-conductive nanoparticles, based on the theoretical dry extract of the composition.

In one embodiment, semi-conductive nanoparticles are uniformly dispersed in the polymerizable composition, i.e. each nanoparticle is separated from its nearest neighbour nanoparticle by at least 5 nm, preferably 10 nm, more preferably 20 nm, even more preferably 50 nm, most preferably 100 nm. In other words, semi-conductive nanoparticles are not aggregated in the polymerizable composition. Advantageously, the farther away the particles, the lower the diffusion.

In an embodiment, the semi-conductive nanoparticles comprised in the polymerizable composition have the same formula (I), shape and structure.

In another embodiment, the semi-conductive nanoparticles comprised in the polymerizable composition have different formula (I) and/or different shape and/or different structure. In this embodiment, absorbance of the polymerizable composition may be adjusted by superposition of absorbance of each type of semi-conductive nanoparticles, as taught by Beer-Lambert law.

In this embodiment, the decreasing zone of absorbance curve may be more complex, with a first decrease, then an intermediate plateau, then a second decrease as shown on FIG. 1.2. Hence, two decreasing zones $D_1$ and $D_2$ may be defined, each decreasing zone having a width of less than 100 nm, preferably less than 50 nm, more preferably less than 40 nm, even preferably less than 30 nm. Besides $A_2$ as defined above still apply and corresponds to two successive decreases.

More than two decreasing zones may be obtained and defined by analogy with the embodiment with two decreasing zones.

Absorbance of a light filtering coating is measured on a 5-micrometer-thick coating comprising semi-conductive nanoparticles. In an embodiment, absorbance is higher than 0.5, preferably 1, more preferably 1.5 for each light wavelength ranging from 350 nm to λcut. $\lambda_{cut}$. $\lambda_{cut}$ may be in the visible range, preferably in the range from 420 nm to 480 nm, preferably from 420 nm to 450 nm.

In one embodiment, absorbance of the polymerizable composition or absorbance of the light filtering layer has:

a local maximum absorbance of highest wavelength in the range from 350 to 480 nm, said local maximum having an absorbance value $A_{max}$ for a wavelength $\lambda_{max}$;

a value of 0.9 $A_{max}$ for a wavelength $\lambda_{0.9}$, $\lambda_{0.9}$ being greater than $\lambda_{max}$;

a value of 0.5 $A_{max}$ for a wavelength $\lambda_{0.5}$, $\lambda_{0.5}$ being greater than $\lambda_{0.9}$; and wherein $|\lambda_{0.5}-\lambda_{0.9}|$ is less than 15 nm.

In a preferred configuration, $|\lambda_{0.5}-\lambda_{0.9}|$ is less than 10 nm, or less than 5 nm.

In an embodiment, absorbance of said light filtering material has a value of 0.1 $A_{max}$ for a wavelength $\lambda_{0.1}$, $\lambda_{0.1}$ being greater than $\lambda_{0.9}$; and wherein $|\lambda_{0.1}-\lambda_{0.9}|$ is less than 30 nm, preferably less than 20 nm, more preferably less than 15 nm.

Additives

The polymerizable composition may further comprise additives in conventional proportions. These additives include stabilizers such as antioxidants, UV light absorbers, light stabilizers, anti-yellowing agents. They should neither decrease the effectiveness of polymerization nor deteriorate optical properties—in particular transparency—of the light filtering coating.

In an advantageous embodiment, the polymerizable composition does not comprise additional UV light absorbers. Indeed, semi-conductive nanoparticles present a significant absorbance for light wavelength ranging from 280 nm to $\lambda_{cut}$. When $\lambda_{cut}$ is selected in the visible range, the whole UV-light ranging from 280 nm to 380 nm is absorbed by semi-conductive nanoparticles and no more UV light absorbers are required in the polymerizable composition.

The polymerizable composition may further comprise a solvent, provided that polymerization is not hindered by the solvent. Solvent may be selected from polar solvents, like water, an alcohol, or water/alcohol mixtures, preferably an alcohol, e.g. methanol, ethanol, n-propanol, isopropanol, n-butanol, isobutanol, sec-butanol, tert-butanol, n-amylic alcohol, isoamylic alcohol, sec-amylic alcohol, tert-amylic alcohol, 1-ethyl-1-propanol, 2-methyl-1-butanol, 1-methoxy-2-propanol n-hexanol, cyclohexanol, ethyl cellosolve (monoethoxy ethylene glycol), and ethylene glycol.

This disclosure also relates to a light filter for a glass container.

Said light filter is obtained by curing a polymerizable composition comprising semi-conductive nanoparticles.

The absorbance through said light filter having 5 micrometer thickness is higher than 0.5 for each light wavelength ranging from 350 nm to $\lambda_{cut}$, $\lambda_{cut}$ being in the range from 420 nm to 480 nm, and lightness of the light filter is greater than 95.

All features disclosed hereinabove regarding a light filtering coating are suitable for said light filter. In particular features of polymerizable composition and semi-conductive nanoparticles may be embodied in said light filter.

In an embodiment, the chroma of said light filter is lower than 60, preferably lower than 50.

In an embodiment, the light filter is obtained by curing a Sol-Gel polymerizable composition, in particular a Sol-Gel polymerizable composition comprising monomers or oligomers selected from metal alkoxides, alkoxysilanes, alkylalkoxysilanes, epoxysilanes, epoxyalkoxysilanes, and mixtures thereof.

In an embodiment, the light filter is obtained by curing a composition comprising (meth)acrylics monomers or oligomers, epoxy monomers or oligomers, or mixture thereof.

While various embodiments have been described and illustrated, the detailed description is not to be construed as being limited hereto. Various modifications can be made to the embodiments by those skilled in the art without departing from the true spirit and scope of the disclosure as defined by the claims.

EXAMPLES

The present invention is further illustrated by the following examples.

Colorimetry Measurement:

All colorimetry measurements have been obtained after a measure of transmission followed by computation of colour.

Transmission was measured with a JASCO UV-VIS770 spectrometer, with Xenon light source, for a range of wavelength from 380 nm to 780 nm.

Spectrum of Illuminant $D_{65}$ is defined in CIE standards.

Light Filters

Various coatings have been prepared and applied on glass.

Example 1: Filters

Dot in plate semi-conductive nanoparticles (hereafter NP1) of formula $CdSe_xS_{1-x}$, with x=0.3, comprising a $CdSe_{0.5}S_{0.5}$ dot included in a nanoplate of CdS in which composition varies continuously from core to shell, having a thickness of 1.2 nm (corresponding to 4 monolayers), length of 15 nm and width of 20 nm were prepared in heptane according to procedure disclosed in European Patent EP2633102.

0.5 mL of a dispersion comprising NP1 in 10 mM $NaHCO_3$ solution was mixed with 5 mg of Poly(DHLA-co-PEGMEMA) copolymer of 20 mol % dihydrolipoic acid methacrylate and 80 mol % poly(ethylene glycol) methyl ether methacrylate having Mn of 40 and kept under gentle stirring overnight at 60° C. Then sample was washed with ethanol and nanoparticles capped with polymer in ethanol was obtained. This dispersion D1 has a weight content in nanoparticles of 5%.

In addition, a Sol-Gel solution SG was also prepared in a separated vial with 100 µL of (3-Glycidyloxypropyl) trimethoxysilane, 65 µL of diethoxydimethylsilane and 35 µL of 0.1 M HCl. Solution SG was stirred for 24 hours at room temperature.

50 µL of dispersion D1 was added to 200 µL of solution SG to obtain a polymerizable composition then deposited by spin coating on a glass sheet S0 at 400 rpm during 30 s (dispensing step) then 2000 rpm during 2 min (spreading step). The resulting sample was then heated at 150° C. for 6 h in order to obtain a condensed 5 µm thick Sol-Gel coating having a weight content in CdS nanoplates of 1% after curing. The coated glass sheet is S1.

The glass sheet before coating has a lightness of 86,3 and a luminous transmittance of 95%.

After coating, the coated glass sheet has a lightness of 85,73 and a luminous transmittance of 95%. Light filtering coating is highly clear and cosmetic properties of coated bottles are maintained: they appear as bright as uncoated.

Figure 4:
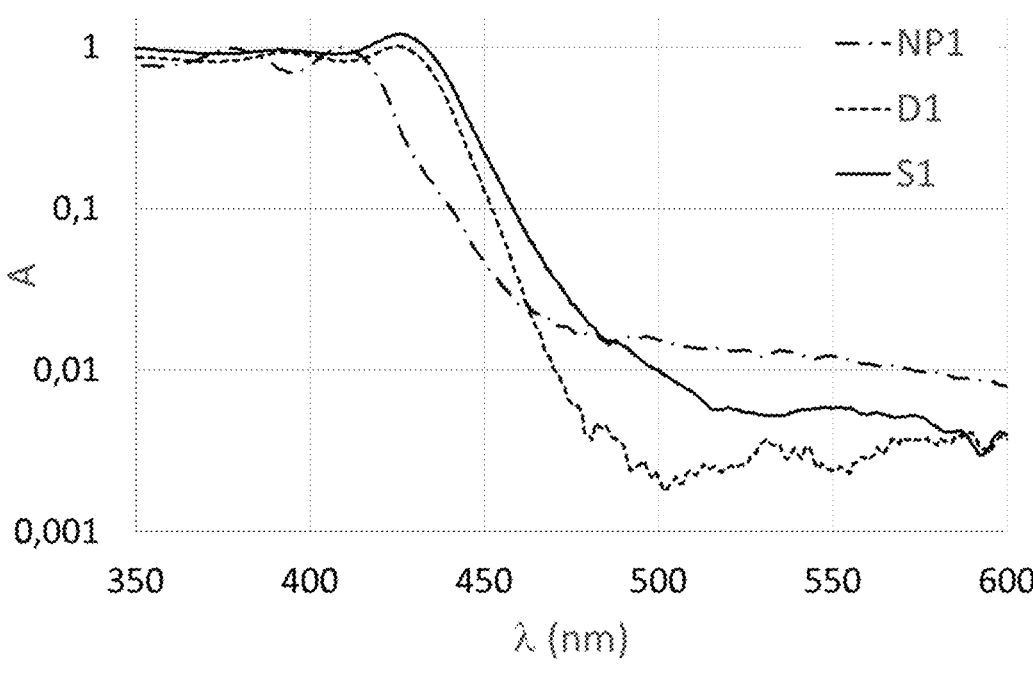
FIG. 4 shows absorbance curves of nanoparticles NP1, dispersion D1 and coated sheet of glass S1 of example 1.

Absorbance curves (A) of nanoparticles NP1 in heptane (semi-dotted line), of dispersion D1 (dotted line) and of the coated glass sheet S1 (solid line) were measured as a function of light wavelength in the UV-visible and are shown on FIG. 4 (logarithmic scale). A wavelength of transition $\lambda_{cut}$ of 425 nm is obtained for the coated glass sheet S1.

Other coatings have been prepared with the same protocol.

Semi-conductive nanoparticles (hereafter NP2) of formula $CdSe_{0.75}S_{0.25}$ and having a shape of plate with length of 12 nm; width of 20 nm and thickness of 1.2 nm (corresponding to 4 monolayers) were prepared according to procedure disclosed in EP2633102.

Semi-conductive nanoparticles (hereafter NP3) of formula CdSe and having a shape of plate with length of 10 nm; width of 22 nm and thickness of 1.2 nm (corresponding to 4 monolayers) were prepared according to procedure disclosed in EP2633102.

Semi-conductive nanoparticles (hereafter NP4) of formula $CdSe_{0.5}S_{0.5}$ and having a shape of plate with length of 10 nm; width of 21 nm and thickness of 1.2 nm (corresponding to 4 monolayers) were prepared according to procedure disclosed in EP2633102.

Semi-conductive nanoparticles (hereafter NP5) of formula CdS and having a shape of plate with length of 10 nm; width of 20 nm and thickness of 1.5 nm (corresponding to 5 monolayers) were prepared according to procedure disclosed in EP2633102.

As reported in example 1, the nanoparticles NP2, NP3, NP4 and NP5 were capped with a Poly(DHLA-co-PEG-MEMA) copolymer to respectively prepare dispersions D2-D5.

Table 2 below shows absorbance properties of dispersions D1 and D5:

TABLE 2

|  | D1 | D5 |
| --- | --- | --- |
| $\lambda_{max}$ | 422 nm | 445 nm |
| $\lambda_{0.9}$ (at $0.9*A_{max}$) | 427 nm | 450 nm |
| $\lambda_{0.5}$ ($0.5*A_{max}$) | 434 nm | 462 nm |
| $\lambda_{0.1}$ ($0.1*A_{max}$) | 446 nm | 479 nm |
| $|\lambda_{0.5} - \lambda_{0.9}|$ | 7 nm | 12 nm |
| $|\lambda_{0.1} - \lambda_{0.9}|$ | 19 nm | 29 nm |

Examples 2: Light Filtering Glass Containers

A commercial glass bottle B0 was used as glass container. The color of B0 is measured in L*a*b* color system: L*=86,3; a*=−0.16 and b*=0.23.

The commercial bottle B0 is dip-coated with dispersions D1-D5, then heated at 150° C. for 6 h in order to obtain a condensed 5 µm thick Sol-Gel coating having a weight content in nanoparticles NP1-NP5 of 1% after curing. Coated bottles are B1-B5.

In addition, a commercial bottle B6 coated with a light filtering film conceived to absorb blue light has been characterized.

Figure 3:
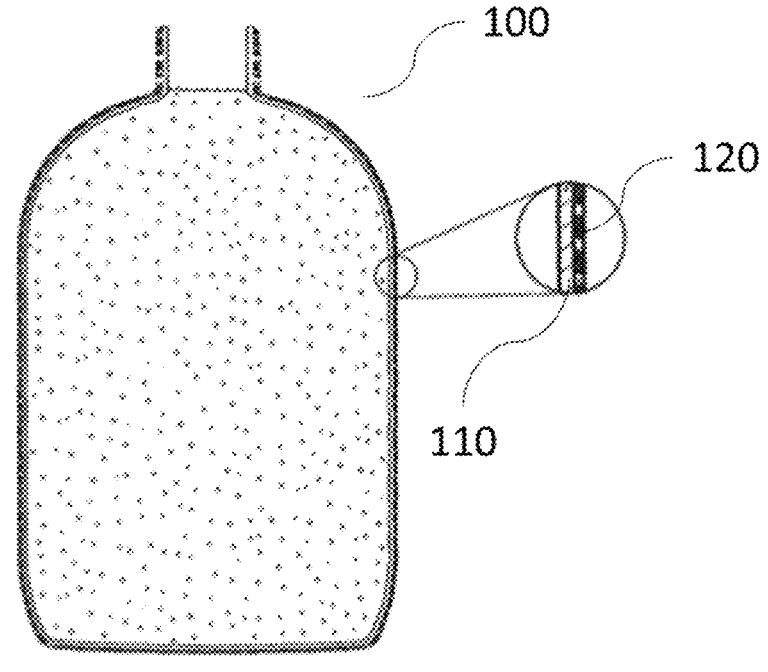
FIG. 3 shows a glass container with a light filtering coating.

FIG. 3 shows such a light filtering glass container (100), where bottle B0 (110) is totally covered with a light filtering coating (120).

Figure 5:
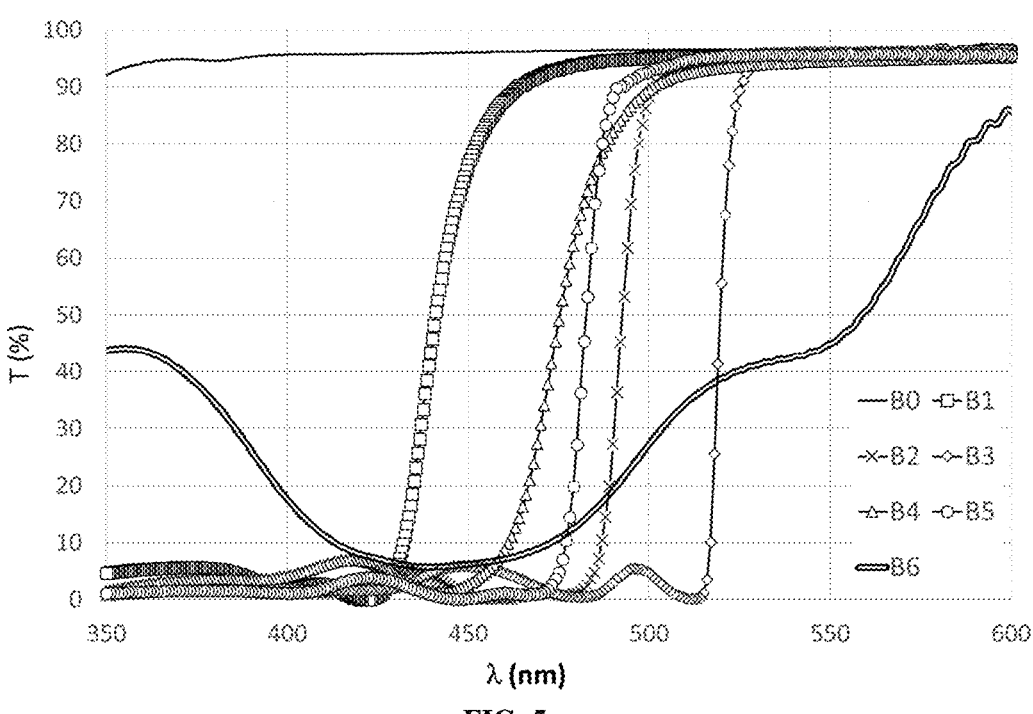
FIG. 5 shows transmission curves T of comparative bottles and bottles coated with light filters according to this disclosure, as a function of light wavelength 2.

FIG. 5 shows light transmission through bottles B0 and B6 as a control and B1-B5.

$\lambda_{cut}$ for bottles B1-B5 are respectively 425 nm, 480 nm, 512 nm, 445 nm and 460 nm. The characteristics of bottles B1 and B5 for $\lambda_{max}$, $\lambda_{0.9}$, $\lambda_{0.5}$ and $\lambda_{0.1}$ are the same as the characteristics of dispersion of nanoparticles D1 and D5 listed in table 2: incorporation of nanoparticles in Sol-Gel coating didn't change absorbance features.

Application to Lightstruck Flavour—Degradation of Riboflavin

A solution of Riboflavin at concentration of 250 mg. $L^{-1}$ is prepared. This solution when measured in a 1 cm path light cuvette presents a maximum of absorbance at 442 nm with absorbance 1.03.

Figure 6:
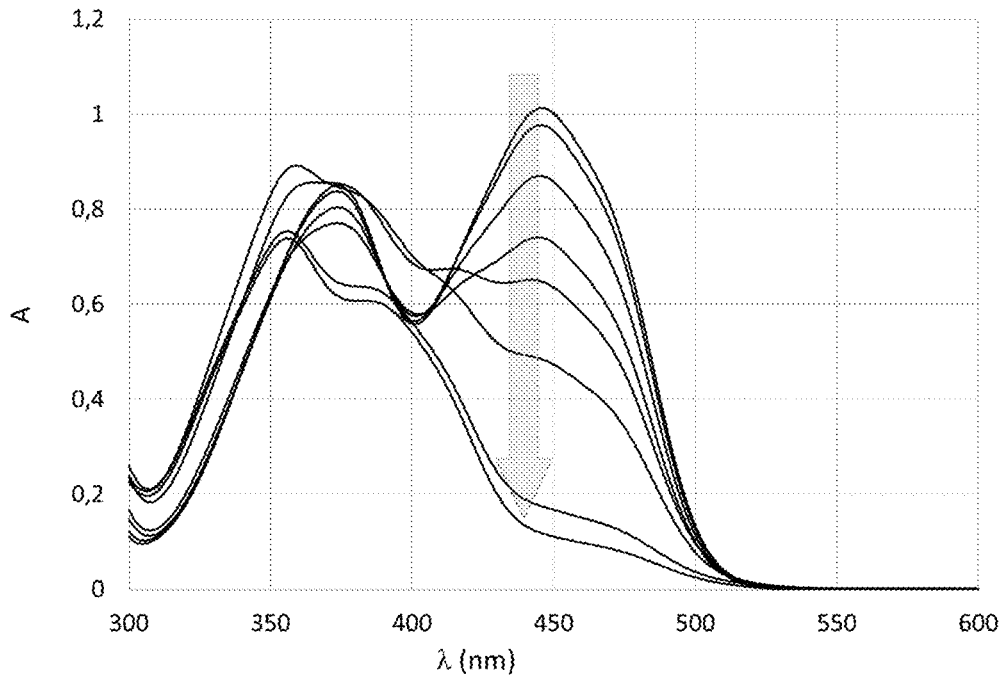
FIG. 6 shows Absorbance A of a Riboflavin solution as a function of light wavelength 2. The solution is irradiated with blue light and Absorbance is measured after increasing duration of light exposition (from 0 to 30 hours).

Bottle B0 was filled with the solution of Riboflavin and exposed to blue LED light exposure for 30 hours (emission spectrum of LED 430-465 nm, irradiance 0.1 W/cm$^2$). Absorbance curves were recorded at different duration of blue light exposure and are shown on FIG. 6 for 0, 1, 4, 7, 12, 15, 24 and 30 hours (in order defined by the arrow). Absorbance at 442 nm is decreasing from 1.03 to 0.124 demonstrating that 88% Riboflavin has been photodegraded after 30 hours of blue light exposure.

The same experiment was reproduced using bottles B1 to B6. As a control, the same measurement was done in a bottle B0, without light exposure.

Table 3 below shows Riboflavine degradation and colorimetric properties of the bottles.

TABLE 3

| Bottle | $\lambda_{cut}$ (nm) | % degradation | Lightness (variation from B0) | Chroma | Luminous transmission |
|---|---|---|---|---|---|
| B0 | NA | 88 | 86.3 | 0.3 | >95% |
| B1 | 425 | 73 | 85.7 (−0.6) | 19.5 | >95% |
| B2 | 480 | 13 | 84.5 (−1.8) | 60 | >95% |
| B3 | 512 | 8 | 81.2 (−5.1) | 83.5 | >95% |
| B4 | 445 | 39 | 85.1 (−1.2) | 52.2 | >95% |
| B5 | 460 | 16 | 85.5 (−0.8) | 56.7 | >95% |
| B6 | NA | 12 | 70 (−16.3) | 72 | >95% |
| B0-No light | NA | <2% | 86.3 (0) | 0.3 | NA |

Table 3 demonstrates that degradation of Riboflavin contained in bottles B1 to B5 has been prevented thanks to light filtering coating.

Comparative bottle B6 is efficient for Riboflavin protection (12% degradation) but decreases lightness by 16.3: Bottle B6 appears drab, and strongly coloured in orange.

Besides, bottle B3 has a large effect on brightness (−5.1) and a very strong colour (larger chroma than reference B6, even if lightness is less decreased). Indeed, $\lambda_{cut}$ for B3 is about 512 nm, much larger than 480 nm which has been identified as the upper limit for $\lambda_{cut}$ providing a good balance between an efficient light filtering and a high lightness.

Comparison of bottles B2 and B6 shows that the same protection of Riboflavin is achieved (13% and 12% of degradation), but B2 is brighter: lightness of glass bottle is almost unchanged (from 86.3 to 84.5, to be compared to the lightness of B6:70) and chroma is lower (60 for B2 and 72 for B6).

Finally, bottles B1, B2, B4 and B5 are good light filtering glass containers, providing protection against development of lightstruck flavour in beverages without degrading brightness of glass containers.

The invention claimed is:

1. A light filtering glass container comprising:
   (i) a glass container having a colour (L*ug, C*ug, h*ug);
   (ii) a light filtering coating obtained by curing a polymerizable composition comprising semi-conductive nanoparticles, said light filtering coating being on at least a part of the glass container;
   wherein the glass container with the light filtering coating has a colour (L*cg, C*cg, h*cg);
   wherein the absorbance through a 5-micrometer thick light filtering coating is greater than 0.5 for each light wavelength ranging from 350 nm to $\lambda_{cut}$, $\lambda_{cut}$ being in the range from 420 nm to 480 nm; and
   wherein the difference of lightness between the uncoated glass container and the glass container with the light filtering coating is lower than 5.

2. The light filtering glass container according to claim 1, wherein the luminous transmission of the glass container with the light filtering coating is greater than 90% of the luminous transmission of the uncoated glass container.

3. The light filtering glass container according to claim 2, wherein the luminous transmission of the glass container with the light filtering coating is greater than 95% of the luminous transmission of the uncoated glass container.

4. The light filtering glass container according to claim 1, having a chroma C*cg lower than 60.

5. The light filtering glass container according to claim 1, having a chroma C*cg lower than 50.

6. The light filtering glass container according to claim 1, wherein the polymerizable composition is a Sol-Gel polymerizable composition.

7. The light filtering glass container according to claim 6, wherein Sol-Gel polymerizable composition comprises monomers or oligomers selected from metal alkoxides, alkoxysilanes, alkylalkoxysilanes, epoxysilanes, epoxyalkoxysilanes, and mixtures thereof.

8. The light filtering glass container according to claim 6, wherein the thickness of light filtering coating is in a range from 1 μm to 15 μm.

9. The light filtering glass container according to claim 6, wherein the thickness of light filtering coating is in a range from 1 μm to 10 μm.

10. The light filtering glass container according to claim 1, wherein polymerizable composition comprises (meth) acrylics monomers or oligomers, epoxy monomers or oligomers, or mixture thereof.

11. The light filtering glass container according to claim 10, wherein the thickness of the light filtering coating is in a range from 2 μm to 100 μm.

12. The light filtering glass container according to claim 10, wherein the thickness of the light filtering coating is in a range from 3 μm to 50 μm.

13. The light filtering glass container according to claim 1, wherein the semi-conductive nanoparticles comprise a material of formula $M_xQ_yE_zA_w$ (I), wherein:
   M is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof;
   Q is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof;
   E is selected from the group consisting of O, S, Se, Te, C, N, P, As, Sb, F, Cl, Br, I, or a mixture thereof;
   A is selected from the group consisting of O, S, Se, Te, C, N, P, As, Sb, F, Cl, Br, I, or a mixture thereof; and
   x, y, z and w are independently a decimal number from 0 to 5; x, y, z and w are not simultaneously equal to 0; x and y are not simultaneously equal to 0; z and w may not be simultaneously equal to 0.

14. A light filter for a glass container obtained by curing a polymerizable composition comprising semi-conductive nanoparticles
   wherein the absorbance through a 5-micrometer thick light filter is higher than 0.5 for each light wavelength ranging from 350 nm to $\lambda_{cut}$, $\lambda_{cut}$ being in the range from 420 nm to 480 nm; and
   wherein the lightness of the light filter is greater than 95.

15. The light filter according to claim 14, having a chroma C* lower than 60.

16. The light filter according to claim 14, having a chroma C* lower than 50.

17. The light filter according to claim 14, wherein the polymerizable composition is a Sol-Gel polymerizable composition.

18. The light filter according to claim 17, wherein the Sol-Gel polymerizable composition comprises monomers or oligomers selected from metal alkoxides, alkoxysilanes, alkylalkoxysilanes, epoxysilanes, epoxyalkoxysilanes, and mixtures thereof.

19. The light filter according to claim 14, wherein the polymerizable composition comprises (meth) acrylics monomers or oligomers, epoxy monomers or oligomers, or mixture thereof.

\* \* \* \* \*